United States Patent
Mantese et al.

(10) Patent No.: US 7,064,950 B2
(45) Date of Patent: Jun. 20, 2006

(54) CIRCUIT DEVICE COMPRISING MULTIPLE POLARIZATION-GRADED FERROELECTRIC ELEMENTS AND METHOD OF USING

(75) Inventors: Joseph V. Mantese, Shelby Township, MI (US); Norman W. Schubring, Troy, MI (US); Adolph L. Micheli, Harrison Township, MI (US)

(73) Assignee: Delphi Technologies, Inc., Troy, MI (US)

( * ) Notice: Subject to any disclaimer, the term of this patent is extended or adjusted under 35 U.S.C. 154(b) by 352 days.

(21) Appl. No.: 10/388,336

(22) Filed: Mar. 13, 2003

(65) Prior Publication Data

US 2004/0178841 A1 Sep. 16, 2004

(51) Int. Cl.
*H02H 3/00* (2006.01)
(52) U.S. Cl. .................................................. 361/225
(58) Field of Classification Search ................ 361/225
See application file for complete search history.

(56) References Cited

U.S. PATENT DOCUMENTS

| | | | |
|---|---|---|---|
| 3,443,170 A * | 5/1969 | Pulvai | 257/43 |
| 5,272,341 A | 12/1993 | Micheli et al. | 250/338.2 |
| 5,386,120 A | 1/1995 | Micheli et al. | 250/338.2 |
| 5,448,067 A | 9/1995 | Micheli | 250/338.2 |
| 6,294,784 B1 | 9/2001 | Schubring et al. | 250/338.2 |
| 6,346,865 B1 | 2/2002 | Callewaert et al. | 333/185 |

OTHER PUBLICATIONS

Mantese, et al; *Stress-induced polarization-graded ferroelectrics*, Applied Physics Letter, vol. 81, No. 6; Aug. 5, 2002; p. 1068-1070.
Mantese, et al; *Polarization-graded ferroelectrics: Transpacitor push-pull anplifier*; Applied Physics Letter, vol. 80, No. 9; Mar. 4, 2002; p. 1-2.

* cited by examiner

*Primary Examiner*—Stephen W. Jackson
(74) *Attorney, Agent, or Firm*—Stefan V. Chmielewski

(57) ABSTRACT

A circuit device that make use of graded ferroelectric structures and techniques by which such structures can be excited by external and internal stimuli to render the device useful for a variety of circuit applications. The device comprises at least two ferroelectric films, each of the films having a graded dipole moment in a thickness direction normal to the surfaces thereof. The graded dipole moment of each film is effective to produce a change in the dipole charge density, and hence an apparent net charge, on the first and second surfaces of each film when an alternating electric field is applied to the film and additional energy is imparted to the film. By providing an electrical connection between the films, changes in the dipole charge density of the films generated by application of the alternating electric field yield a device charge separation output that differs from the individual changes in the dipole charge density of the films.

40 Claims, 5 Drawing Sheets

CIRCUIT DEVICE COMPRISING MULTIPLE POLARIZATION-GRADED FERROELECTRIC ELEMENTS AND METHOD OF USING

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to ferroelectric materials and devices. More particularly, this invention relates to circuit devices comprising two or more ferroelectric elements with polarization gradients, wherein the elements can be constructed on a common platform together with a number of active or passive components, such as transistors, resistors, capacitors and inductors.

(2) Description of the Related Art

Up until quite recently, the primary focus of ferroelectric thin film research has been to reliably reproduce the properties of bulk materials in thin film form. However, the study of ferroelectric thin film materials only in terms of their bulk properties fails to capture the full richness of these materials, much as a limited study of the bulk properties of semiconductor materials would fail to anticipate their use as compositionally-doped structures such as diodes and transistors. It is with this realization that the growth and analysis of chemically and structurally non-uniform ferroelectric materials have been undertaken. A variety of ferroelectric material systems have been considered, including but not limited to barium strontium titanate ($Ba_{1-x}Sr_xTiO_3$; BST), potassium tantalum niobate ($KTa_{1-x}Nb_xO_3$; KTN), lead calcium titanate ($Pb_{1-x}Ca_xTiO_3$; PCT), lead zirconate titanate ($PbZr_xTi_yO_3$; PZN), lead strontium titanate ($Pb_{1-x}Sr_xTiO_3$; PST), and lead lanthanum titanate ($Pb_{1-x}La_xTiO_3$; PLT).

When subjected to an applied electric field, a rapid and major polarizing effect occurs in a ferroelectric material, and remnant polarization is observed both in the presence and after removal of the field. As reported in commonly-assigned U.S. Pat. Nos. 5,272,341, 5,386,120 and 5,448,067 to Micheli et al., a ferroelectric material having a graded composition exhibits a new hysteresis effect, manifested by a hysteresis loop translation along the polarization axis in a polarization (P) versus electric field (E) plot. Micheli et al. report that a significant and unexpected pseudo-pyroelectric response is exhibited by such ferroelectric heterostructures (what are termed herein graded ferroelectric devices, or GFD's), as a result of a gradient in dipole moment (charge) density (and therefore, a polarization gradient) normal to the growth surface. Much like semiconductor diode junctions, which produce asymmetric current-voltage characteristics as a result of "built in" potentials across chemically graded junction regions, Micheli et al. showed that polarization-graded ferroelectrics exhibit shifted charge-voltage hysteresis ("up" and "down") loops which are also attributed to "built in" potentials. Unlike semiconductor junctions, however, whose potentials arise from a diffusion of free charge across chemically graded junctions, the intrinsic potentials in graded ferroelectrics are due to gradients in bound charge or dipole moment density. These potentials may be shaped in much the same manner as advanced forms of semiconductor devices (such as quantum well structures) by suitably tailoring the gradients in permanent dipole charge density.

To understand the behavior of GFD's, one can consider the properties of a ferroelectric with a linearly graded polarization P (bound charge dipole-moment per unit volume) normal to the growth surface (the substrate/film interface arbitrarily designated z=0), and write $P(z)=D(z)-\epsilon_o E(z)$. Here, $\epsilon_o$ is the permittivity of free space, D the electric displacement, and E the electric field. For ferroelectrics, at any fixed z, P(z) changes abruptly from zero (P(z)=0 when E=0) at a Curie temperature $T_c(z)$ and increases or remains essentially constant with decreasing temperature below the transition temperature, as shown schematically in FIG. 1. Below the lowest Curie temperature of a GFD, the free-energy diagram for the structure would appear as in FIG. 2 where, with depth, there is a series of double-well structures characteristic of the two polarization states. Unlike a structure consisting of discrete laminated layers of ferroelectric, however, each well is skewed to lower energy (in this example with decreasing z) because the gradient in polarization is a coentinuous function of depth.

FIGS. 3 and 4 schematically represent, respectively, a polarization-graded ferroelectric film connected to an alternating voltage source, and the resulting dipole-moment profile through the material. The dipole-moment gradient through the ferroelectric film is normal to the film thickness (parallel to the z-axis of the material), and alternating voltage is applied across the thickness of the film. The degree of dipole alignment and polarization strength are functions of many parameters, including temperature, pressure (stress/strain), composition, and applied external electric field (E). As such, the polarization gradient may be achieved by any number of methods, such as (1) the imposition of a temperature gradient through the film thickness, (2) a compositional gradient normal to the film growth surface, and (3) a stress/strain gradient through the film thickness. As reported in the above-noted patents to Micheli et al., normal hysteresis for a uniformly polarized ferroelectric film is seen in a polarization versus field (P vs. E) plot, which shows how the polarization of a ferroelectric material may be switched between two states. However, as also reported in Micheli et al., the presence of a polarization gradient through the ferroelectric film of FIG. 3 alters the usual symmetry found in a Q vs. V plot, as shown in FIG. 5 (where Q is meant to mean dipole-moment per area). In the polarization-graded ferroelectric film, there is an internal electric field generated by the polarization gradient. This internal electric field occurs across both the ferroelectric and the sampling capacitor found in typical measurement circuitry, such as the modified Sawyer-Tower circuit, where the two voltages are equal but in opposition. This non-zero internal electric field gives rise to a measurable potential V, manifested as a shift in static (dc) voltage when an alternating (ac) voltage (e.g., sine wave) is applied to the film, indicating that there is a significant voltage developed by a gradient in the dipole-moment per unit area.

For small gradients in composition, temperature or stress, the dc voltage shift V may be written:

$$V = K\nabla q \tag{Eq. 1}$$

with K a constant which may depend upon temperature, and $\nabla q$ may be: $\nabla c$, a compositional gradient; $\nabla T$, a temperature gradient; $\nabla\sigma$, a stress gradient. As such, the graded dipole moment of the film produces a charge increase on the opposing surfaces of the film when a constant ac voltage is applied to the film surfaces and additional energy (e.g., thermal, radiant, mechanical, or electrical) is imparted to the film, such that an internal electric field produces a potential that varies in response to the additional energy and causes a translation of the hysteresis loop along the charge separation axis (Q) of the charge separation versus voltage plot (Q vs. V), as represented in FIG. 5. The degree of translation along the charge separation axis is a function of the additional energy imparted to the film (e.g., temperature, pressure, applied field, etc.), and the observed translation of the hysteresis loop is a dc offset that is a measure of the additional energy. Both forward-polarized ("up") and reversed-polarized ("down") GFD's can be fabricated by suitably grading the polarization, such as by grading the barium to strontium ratio in a barium strontium titanate ($Ba_{1-x}Sr_xTiO_3$) film. Similar results have likewise been observed in a variety of other material systems, including potassium tantalum niobates, lead calcium titanate, lead zirconate titanate, and lead lanthanum titanate GFD's.

In view of the above, while a semiconductor junction has an asymmetric current-voltage characteristic (free charge flow in the presence of an applied field), FIG. 5 shows that a polarization-graded ferroelectric structure has a displaced charge-voltage characteristic (net bound charge alignment in the presence of an applied periodic field). Trans-resistive ("transistor") semiconductor devices are formed by modulating the free charge carrier density across an n-p-n or p-n-p junction transistor to create a device which modulates free charge flow and is capable of power gain. In semiconductor transistors, power gain is achieved when a small signal current is injected into the base region of a transistor and is amplified sufficiently to drive a load by means of transistor action. The power sources for transistors are the dc supply voltages. In contrast, a GFD can be termed a transcapacitive ("transpacitor") charge storage/voltage generating device, represented in FIG. 6, wherein the internal potential (V of Equation 1) is altered by a modulating energy flux to the device, such as heat or strain energy, resulting in the dynamic property represented in FIG. 5.

For a GFD, V is also a function of the peak excitation voltage of the ac power source. Therefore, the energy transferred to a capacitive load, C, (approximately $\frac{1}{2}CV^2$ when the load capacitance is large compared to the "capacitance" of the GFD) is a strong function of the small modulating energy flux. This phenomenon may be used to great effect to enhance the pyroelectric property of ferroelectric materials. For a GFD structure one can define an effective or "pseudo" pyroelectric coefficient as:

$$p_{eff} = \partial(\Delta D)/\partial T)E_{ac} \quad (2)$$

where $\Delta D$ is the translation of the hysteresis loop (up or down) at a fixed temperature, and $E_{ac}$ denotes a periodic bias field excitation whose magnitude is held fixed. At constant $E_{ac}$, $p_{eff}$ represents (again, proportional to a sourced energy) the change in the relatively large area swept out by the translated hysteresis loop with temperature due to an injected external heat flux. This "transpacitor" action greatly amplifies the normal pyroelectric coefficient in a GFD, typically yielding (for graded ferroelectric devices) pyroelectric coefficients on the order of 1–10 $\mu C/cm^{2.\circ}$ C., nearly a ten thousand fold increase in sensitivity over that of a non-GFD device.

While the properties of a few rudimentary GFD devices have been characterized and analyzed theoretically, the potential of this technology has yet to be adequately explored. Importantly, there presently does not exist an analogous hybrid model, similar to those developed for transistors, which can guide the designer or theoretician in describing transpacitor behavior. In addition, a robust fundamental analysis of such structures has not been undertaken, thus leaving ample opportunity for the discovery of new effects related to GFD's. Therefore, while research thus far is quite compelling from a basic science point of view, the real applicability of the technology resides in the ability to form electronic devices that make use of the unique properties of a GFD.

BRIEF SUMMARY OF THE INVENTION

The present invention provides electronic devices that make use of GFD structures and techniques by which such structures can be excited by external and internal stimuli to render the devices useful for a variety of electronic applications.

According to a first aspect of the invention, an electronic device is provided that comprises at least two ferroelectric films, each of the films having a graded dipole moment in a thickness direction normal to a first surface thereof and continuing to an oppositely-disposed second surface thereof. The graded dipole moment of each film is effective to produce a change in the dipole charge density and hence an apparent net charge on the first and second surfaces of the film when an alternating electric field is applied to the film and additional energy is imparted to the film. Such additional energies may be the result of external stimuli from different environment surrounding the films. For example, the additional energy imparted to either or both of the films may be in the form of thermal, radiant, mechanical and/or electrical energy.

According to the invention, by contacting one of the surfaces of a first of the films and one of the surfaces of a second of the films with an electrical connection to form a junction, the dipole charge density changes generated in the films by application of an alternating electric field combine to yield a device charge separation output that differs from the individual dipole charge density changes of the films. In effect, an internal voltage is generated within each film that attempts to induce a charge on the other film, as well as any load capacitor placed in the circuit. The films can be coupled with the electrical connection so that the dipole charge density changes of the films cancel each other and the device charge separation output is substantially zero if the films are subjected to identical forms and levels of additional energy. As such, according to a second aspect of the invention, the present invention also provides a method that comprises imparting different additional energies to the films, such that the device charge separation output produced is a measure of the different additional energies imparted to the films.

In view of the above, the present invention provides "transpacitor" devices comprising graded ferroelectric films that are, for example, electrically joined in series, e.g., back-to-back, in which case the translation seen by each individual film under normal alternating voltage excitation is not apparent from the device output, yielding what can be termed a balanced configuration as a result of there being an effective cancellation of the two opposing dipole charge density outputs of the individual films. The two films continue to oppose each other, i.e., balance, as long as their environments remain identical. However, if either film is selectively exposed to a different additional external stimulus, such as thermal energy (temperature), radiant energy (e.g., infrared radiation), mechanical energy (e.g., pressure), or applied voltage (dc or ac), the dipole charge density outputs of the two devices will become unbalanced, yielding a loop translation in the device output. Such a loop translation is capable of being an amplified response (using transistors, capacitors and other active and passive electronics components) to the relative levels of external stimuli to the films, and therefore can be used as an output signal to indicate differences in temperature, pressure, applied field, etc. Circuit devices comprising graded ferroelectric films in other arrangements are also within the scope of this invention. For example, graded ferroelectric films can be electrically joined front-to-front or front-to-back in series, or in parallel, to produce a desired electrical effect.

Other objects and advantages of this invention will be better appreciated from the following detailed description.

DETAILED DESCRIPTION OF THE INVENTION

Figure 7:
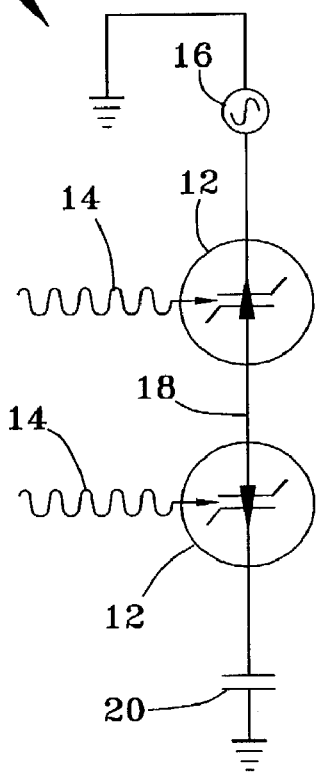
FIG. 7 is an electrical schematic of a balanced circuit device utilizing back-to-back polarization-graded ferroelectric devices in accordance with one embodiment of the present invention.

FIG. 7 represents a circuit device 10 that makes use of multiple polarization-graded ferroelectric devices 12 in accordance with an embodiment of the present invention. In particular, FIG. 7 depicts a pair of back-to-back polarization-graded ferroelectric devices 12, each of which can be individually excited by external and internal stimuli to produce a useful response. The devices 12 are each preferably formed of a film of ferroelectric material in which a polarization gradient exists. Suitable ferroelectric materials include barium strontium titanates, potassium tantalum niobates, lead calcium titanates, lead zirconate titanates, and lead lanthanum titanates, though it is foreseeable that other ferroelectric materials could be used. The polarization gradient through each device 12 is oriented parallel to the z-axis of the device 12. The polarization gradient, including the degree of dipole alignment and polarization strength within each device 12, is a function of many parameters, including temperature, pressure (stress/strain), composition, and external electric field (E) applied to the devices 12. For example, for a device 12 formed by a film of barium strontium titanate, a polarization gradient can be established by grading the relative levels of barium and strontium through the thickness (z-axis) of the film. Suitable materials and processes for producing the films (devices 12) are taught in the aforementioned commonly-assigned U.S. Pat. Nos. 5,272, 341, 5,386,120 and 5,448,067 to Micheli et al., which are incorporated herein by reference. As previously noted, a suitable polarization gradient can also be achieved by other methods, such as the imposition of a temperature and/or stress/strain gradient through the thickness of either or both films. Suitable film thicknesses can vary significantly, depending on the intended application, though in most instances a suitable thickness is about 10 nm to about 500 nm for each film.

Figure 1:
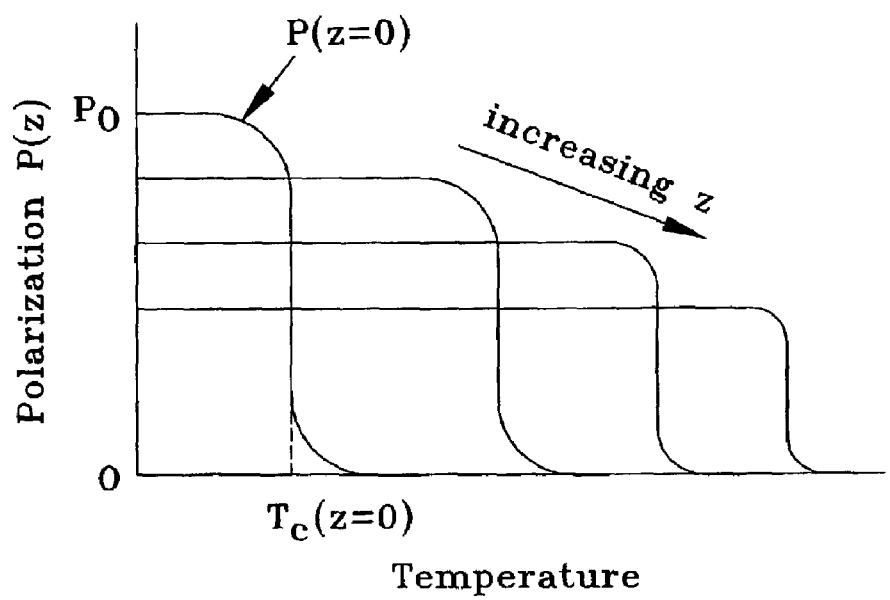
FIG. 1 represents the temperature dependence of polarization at various positions within a polarization-graded ferroelectric material.
Figure 2:
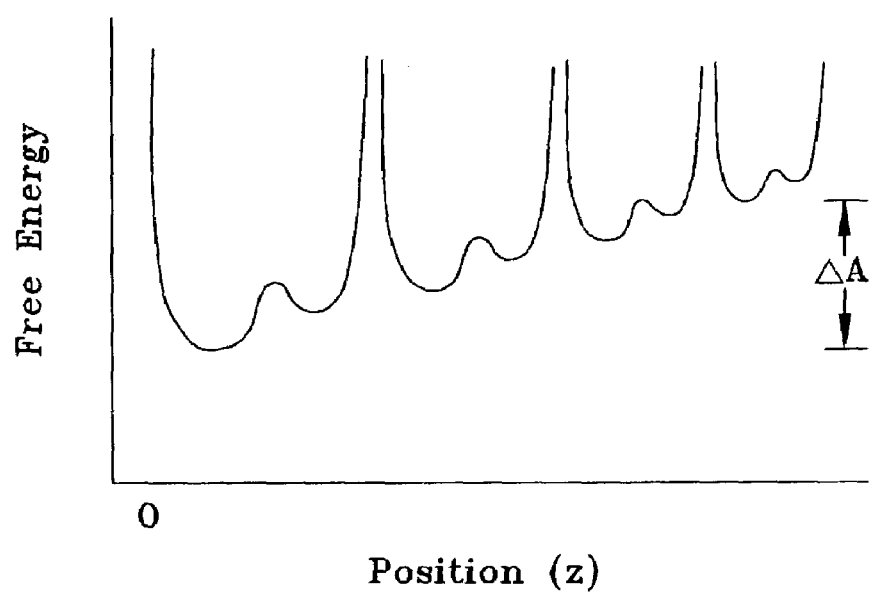
FIG. 2 is a free-energy diagram of the polarization-graded ferroelectric material of FIG. 1.
Figure 3:
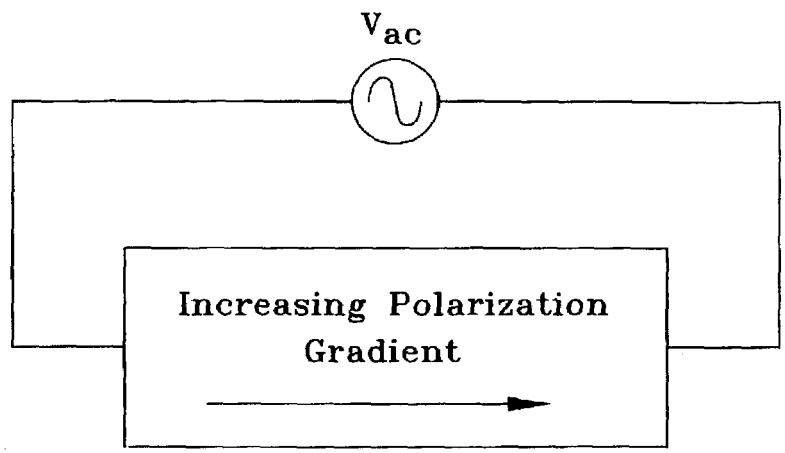
FIGS. 3, 4 and 5 schematically represent a polarization-graded ferroelectric device, the charge density profile of such a device when subjected to an ac applied voltage, and a hysteresis loop shift exhibited by such a device when an additional external stimulus is imparted to the device.
Figure 4:
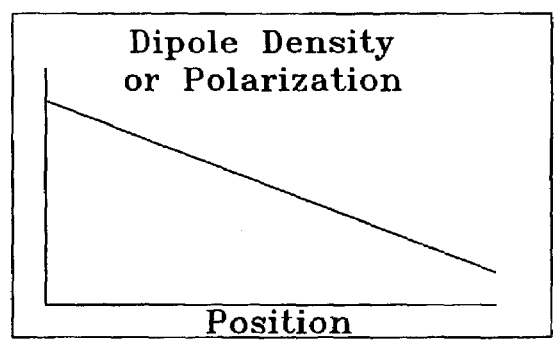
Figure 5:
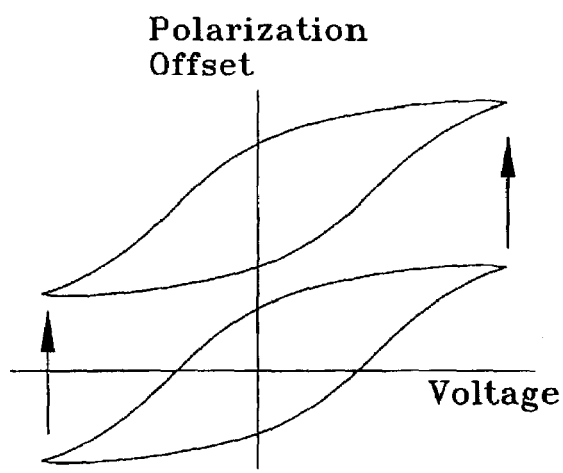
Figure 6:
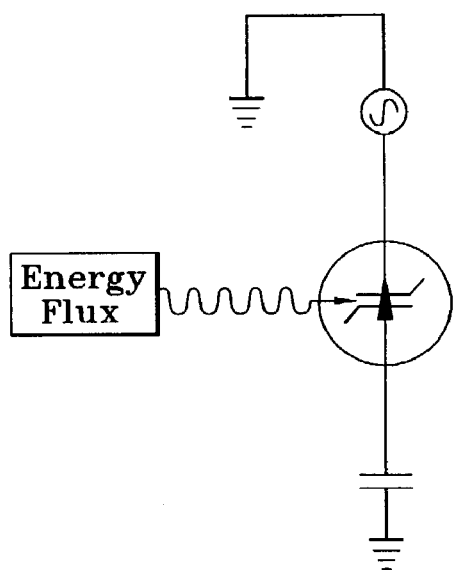
FIG. 6 is an electrical schematic of the polarization-graded ferroelectric device of FIG. 3.

In FIG. 7, the devices 12 are in series and excited with an applied ac voltage 16, such as a sine wave, though other forms of excitation could be used. In accordance with the Micheli et al. patents, periodic excitation of the devices 12 causes the normal hysteresis of the ferroelectric material of each device 12 to be substantially altered, yielding a translation of the hysteresis loop along the charge separation axis of the charge separation versus voltage plot for the device 12, in the same manner as shown in FIG. 5. The degree of translation along the charge separation axis is a function of temperature, pressure and/or electrical field applied to the device 12.

The ferroelectric devices 12 are referred to as being "back-to-back" in the sense that the polarization gradients of the devices 12 are oriented opposite each other, such that the surfaces of the devices 12 at which the minimum polarization strength exists are electrically connected directly to each other, either by physical contact (e.g., as a result of the thin-film growth process) or through a conductor, to form what is effectively a junction 18. Other orientations of the devices 12 are also contemplated by this invention, including back-to-front, front-to-front, etc., as depicted in FIGS. 8 through 11, as well as the use of more than two devices 12. In the embodiment represented by FIG. 7, the back-to-back arrangement causes the translations exhibited by each device 12 under normal ac excitation to cancel each other when measuring the output of the circuit device 10 at the energy storage component (load capacitor) 20 in FIG. 7, yielding what is termed herein a balanced configuration. Such a capability has been demonstrated using two back-to-back graded-polarization ferroelectric films, each formed of potassium tantalum niobate ($KTa_{0.6}Nb_{0.4}O_3$) and deposited by metallo-organic decomposition (MOD) to have a thickness of about 10 micrometers. The polarization gradient was established in each film by depositing the films to have a gradient in the $KNbO_3$:$KTaO_3$ ratio. Though physically separated, the films were electrically connected with a conductor so as to be electrically back-to-back, and an ac voltage was applied having an amplitude of about 30 V and a frequency of about 1 to 10 kHz.

With the two devices 12 having essentially identical physical properties and opposing each other as described above, their individual outputs will balance each other as long as their environments remain identical. In FIG. 7, the environments of the devices 12 are represented as being influenced by external stimuli 14, which may be in the form of thermal energy (temperature), mechanical energy (e.g., pressure), electrical energy (applied ac or dc voltage), etc. The hysteresis loop centered at the (0,0) origin of the charge separation and voltage axes of the plot in FIG. 5 is representative of the resultant output for the circuit device 10 under a balanced condition. As such, when balanced the output of the device 10 is similar to a ferroelectric material not having a polarization gradient. However, if one of the devices 12 is selectively exposed to a different or otherwise additional stimulus 14 (e.g., temperature, pressure, applied voltage, etc.), then the individual outputs of the two devices 12 become unbalanced, yielding a loop translation in the output of the device 10 similar to the translation seen in the hysteresis loop of FIG. 5. This translation is effectively an amplification of the difference(s) in the stimuli 14 to the devices 12, and as such can be utilized as a signal that is a function of the relative levels and/or types of stimuli 14 to the devices 12. Accordingly, the device 10 of FIG. 7 could be used to sense temperature, pressure, voltage, etc.

Figure 8:
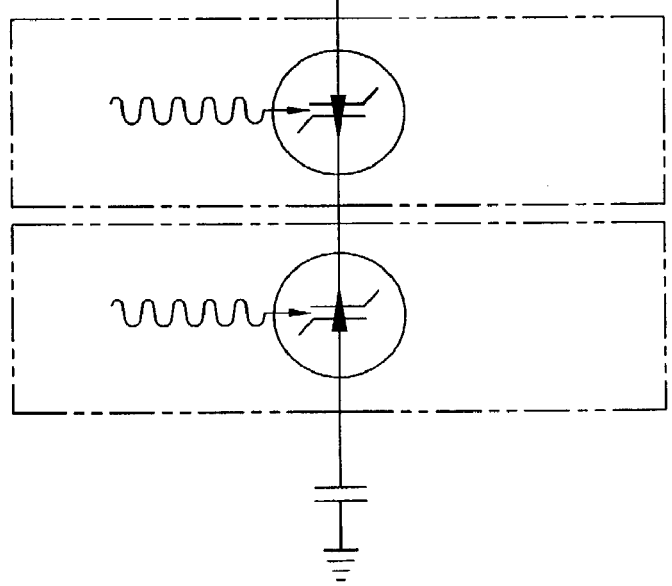
FIGS. 8 through 11 are electrical schematics of additional types of circuit devices utilizing polarization-graded ferroelectric devices in accordance with the present invention.
Figure 10:
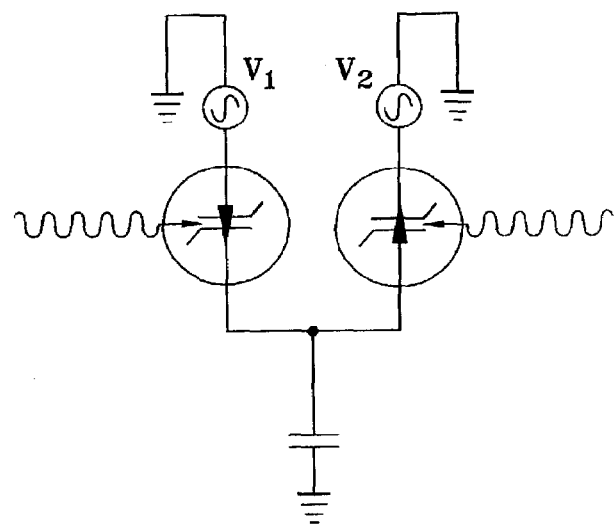
Figure 11:
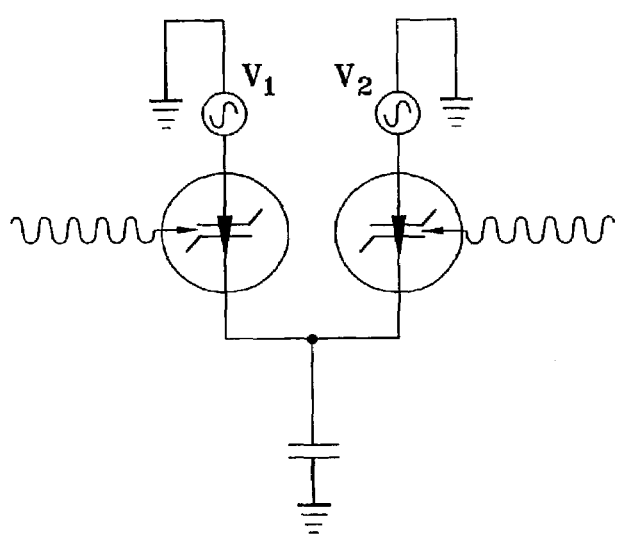
Figure 12:
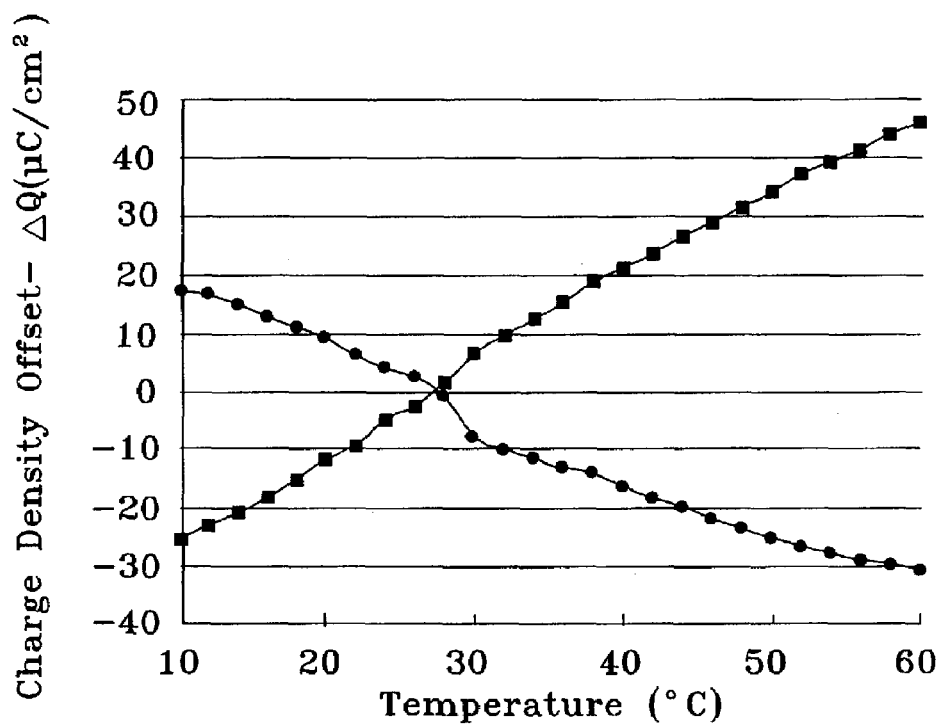
FIG. 12 represents the temperature dependence of charge density offset of the devices of FIG. 8.

FIGS. 8 through 11 represent circuit devices that make use of multiple polarization-graded ferroelectric devices of the type described for FIG. 7, but in accordance with additional embodiments of this invention. In FIG. 8, a pair of front-to-front polarization-graded ferroelectric films are arranged in a configuration analogous to the well-known transistor push-pull amplifier with common-mode rejection, wherein the films are placed in separate environments (as indicated by the phantom boxes in FIG. 8). In an experiment with a circuit device configured in this manner, off-setting potentials yielded a null response across the load capacitor (0.1 μf) when both films were held at the same uniform temperature, excited by the same drive potential (60 V peak and 1 kHz sine wave), and similarly strained. The push-pull nature of the device was demonstrated by placing the films in separate temperature-regulated chambers. When the films were subjected to the same temperature, e.g., about 27° C., essentially normal hysteresis was observed. However, when the films were subjected to different temperatures, an up or down translation was observed, depending on which film was subjected to the higher temperature. In FIG. 12, the square-shaped bullets indicate that a net down translation developed (across the load capacitor) that increased in magnitude with increasing temperature of the up device (device #2 in FIG. 8), with the circular bullets indicate that the reverse behavior occurred when device #1 was heated or cooled relative to device #2. As such, the circuit device configuration shown in FIG. 8 is capable of both nulling out small common mode signals and tracking variations in the local environment of each polarization-graded ferroelectric device. The same results were obtained when the two devices were interchanged but their orientations maintained, yielding the configuration of FIG. 7. This phenomenon occurs because the observed offsets are the result of internal potentials built into the ferroelectric films that act to "pump" charge onto the load capacitor. As such, unlike semiconductor junction devices, polarization-graded ferroelectric devices are insensitive to the direction of ac charge flow.

Figure 9:
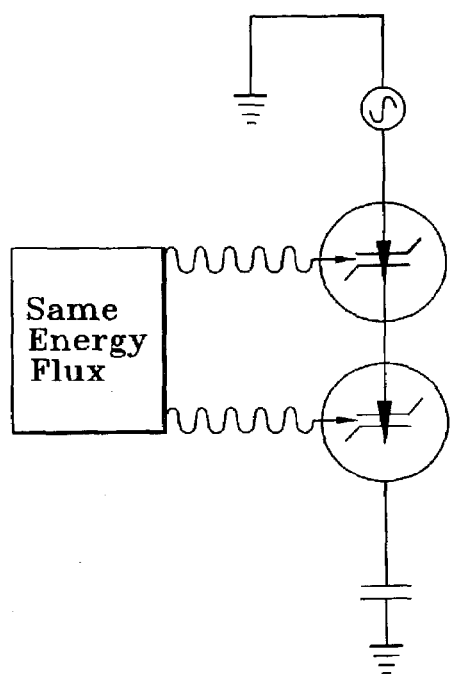

FIG. 9 shows a pair of front-to-back polarization-graded ferroelectric devices, capable of operating as a cascade amplifier when excited by the same external stimuli. Finally, FIGS. 10 and 11 depict two embodiments in which polarization-graded ferroelectric devices are arranged in parallel, with a common ground, separate inputs and separate alternating supply potentials. These configurations therefore allow the output potential across the load capacitor to be more strongly affected by one or the other transpacitor elements (assuming they are essentially identical elements). This configuration thus allows one to adjust for the relative strengths of two unrelated stimuli. Variation from up to down devices in FIGS. 9, 10 and 11 permit alternate sign response of the output.

While the invention has been described in terms of a preferred embodiment, it is apparent that other forms could be adopted by one skilled in the art. Accordingly, the scope of the invention is to be limited only by the following claims.

The invention claimed is:

1. A circuit device comprising:
    at least two ferroelectric films, each of the films having a graded dipole moment in a thickness direction normal to a first surface thereof and continuing to an oppositely-disposed second surface thereof, the graded dipole moment of each film being effective to produce a change in the dipole charge density and hence an apparent net charge on the first and second surfaces of the film when an electric field is applied to the film and additional energy is imparted to the film; and
    an electrical connection contacting one of the first and second surfaces of a first of the films and one of the first and second surfaces of a second of the films so as to form a junction, wherein the changes in the dipole charge density of the films generated by applying an alternating electric field yield a device charge separation output that differs from each of the changes in the dipole charge density of the films.

2. The circuit device according to claim 1, wherein the films are subjected to different environments.

3. The circuit device according to claim 2, wherein the different environments of the films are the result of the films being subjected to different additional energies.

4. The circuit device according to claim 1, wherein the films are coupled with the electrical connection so that the changes in the dipole charge density of the films cancel each other and the device charge separation output is substantially zero if the films are subjected to identical environments.

5. The circuit device according to claim 1, wherein the graded dipole moment of each of the films is associated with a polarization gradient that increases in the thickness direction, and the first surfaces of the films are coupled with the electrical connection.

6. The circuit device according to claim 1, wherein the graded dipole moment of each of the films is associated with a polarization gradient that increases in the thickness direction, and the second surfaces of the films are coupled with the electrical connection.

7. The circuit device according to claim 1, wherein the graded dipole moment of each of the films is associated with a polarization gradient that increases in the thickness direction, and the electrical connection couples the first surface of the first film with the second surfaces of the second film.

8. The circuit device according to claim 1, wherein the first and second films are electrically in series.

9. The circuit device according to claim 1, wherein the first and second films are electrically in parallel.

10. The circuit device according to claim 9, wherein the first and second films share a common ground.

11. The circuit device according to claim 1, wherein the graded dipole moment of at least one of the films is produced by a compositional gradient in the film.

12. The circuit device according to claim 1, wherein the graded dipole moment of at least one of the films is produced by a temperature gradient in the film.

13. The circuit device according to claim 1, wherein the graded dipole moment of at least one of the films is produced by a pressure gradient in the film.

14. The circuit device according to claim 1, wherein the graded dipole moment of at least one of the films is produced by an electric field gradient in the film.

15. The circuit device according to claim 1, wherein the graded dipole moment of at least one of the films is produced by a strain gradient in the film.

16. A circuit device comprising:
    at least two thin films in series and formed of a ferroelectric material, each of the films exhibiting a hysteresis loop on a charge versus voltage plot when subjected to an applied electric field, each of the films having a graded composition in a thickness direction normal to a first surface thereof and continuing to an oppositely-disposed second surface thereof, the graded composition of each film causing the film to have a polarization gradient through the thickness thereof in the thickness direction, the polarization gradient of each film being sufficient to generate a nonzero internal electric field when the film is individually subjected to a periodic excitation applied across the first and second surfaces thereof, the internal electric field producing a potential that varies in response to an additional energy imparted to the film to cause a translation of the hysteresis loop along the charge axis of the charge versus voltage plot; and an electrical connection contacting one of the first and second surfaces of a first of the films and one of the first and second surfaces of a second of the films so as to form a junction in series with the films, wherein the potentials produced by the internal electric fields of the films yield a device charge separation output that differs from the potentials produced by the internal electric fields of the films.

17. The circuit device according to claim 16, wherein the films are coupled with the electrical connection so that the potentials produced by the internal electric fields of the films cancel each other and the device charge separation output is substantially zero if the films are subjected to identical environments, and so that the device charge separation output is not zero if the films are subjected to different levels of the additional energy.

18. The circuit device according to claim 16, wherein the translation of the hysteresis loop for each of the films is a dc offset that is a measure of the additional energy imparted to the film.

19. The circuit device according to claim 16, wherein the ferroelectric material is chosen from the group consisting of barium strontium titanates, potassium tantalum niobates, lead calcium titanates, lead zirconate titanates, and lead lanthanum titanates.

20. The circuit device according to claim 16, wherein each of the films has a thickness of about 10 to about 500 nm.

21. The circuit device according to claim 16, wherein the electrical connection is the result of the first and second films physically contacting each other.

22. A method comprising the steps of:
providing a device comprising at least two ferroelectric films, each of the films having a graded dipole moment in a thickness direction normal to a first surface thereof and continuing to an oppositely-disposed second surface thereof, one of the first and second surfaces of a first of the films and one of the first and second surfaces of a second of the films being contacted by an electrical connection so as to form a junction;
applying an electric field to each of the films; and
imparting different additional energies to the films, the graded dipole moment of each film being effective to produce a change in the dipole charge density on the first and second surfaces of each of the film in response to the electric field to yield a device charge separation output.

23. The method according to claim 22, wherein the different additional energies imparted to the films cause the device charge separation output to be a measure of the different additional energies.

24. The method according to claim 22, wherein the films are coupled with the electrical connection so that the changes in the dipole charge density of the films cancel each other and the device charge separation output is substantially zero when the films are subjected to identical levels of the same additional energy.

25. The method according to claim 22, wherein the graded dipole moment of each of the films is associated with a polarization gradient that increases in the thickness direction, and the first surfaces of the films are coupled with the electrical connection.

26. The method according to claim 22, wherein the graded dipole moment of each of the films is associated with a polarization gradient that increases in the thickness direction, and the second surfaces of the films are coupled with the electrical connection.

27. The method according to claim 22, wherein the graded dipole moment of each of the films is associated with a polarization gradient that increases in the thickness direction, and the electrical connection couples the first surface of the first film with the second surfaces of the second film.

28. The method according to claim 22, wherein the first and second films are electrically in series.

29. The method according to claim 22, wherein the first and second films are electrically in parallel.

30. The method according to claim 29, wherein the first and second films share a common ground.

31. The method according to claim 29, wherein a different electric field is applied to each of the films.

32. The method according to claim 22, wherein the graded dipole moment of at least one of the films is produced by a compositional gradient in the film.

33. The method according to claim 22, wherein the graded dipole moment of at least one of the films is produced by a temperature gradient in the film.

34. The method according to claim 22, wherein the graded dipole moment of at least one of the films is produced by a pressure gradient in the film.

35. The method according to claim 22, wherein the graded dipole moment of at least one of the films is produced by an electric field gradient in the film.

36. The method according to claim 22, wherein the graded dipole moment of at least one of the films is produced by a strain gradient in the film.

37. The method according to claim 22, wherein the electric field is the result of exciting the films in series with an ac voltage.

38. The circuit device according to claim 3, wherein the different additional energies comprise electrical energy.

39. The circuit device according to claim 16, wherein the films are subject to different environments in which the films are subjected to different additional energies comprising electrical energy.

40. The method according to claim 22, wherein the additional energies imparted to the films comprise electrical energy.

* * * * *